United States Patent [19]
Ooi et al.

[11] Patent Number: 5,185,583
[45] Date of Patent: Feb. 9, 1993

[54] ACTIVELY BIASED OSCILLATOR

[75] Inventors: Leng H. Ooi, Sunrise; Stephen B. Einbinder, Plantation, both of Fla.

[73] Assignee: Motorola, Inc., Schaumburg, Ill.

[21] Appl. No.: 719,448

[22] Filed: Jun. 24, 1991

[51] Int. Cl.⁵ .......................... H03B 5/12; H03L 1/00; H03L 7/099
[52] U.S. Cl. ......................... 331/15; 331/109; 331/117 D; 331/177 V; 331/183
[58] Field of Search ............. 331/109, 183, 96, 117 D, 331/177 V, 186, 15

[56] References Cited

U.S. PATENT DOCUMENTS

| | | | |
|---|---|---|---|
| 3,815,048 | 6/1974 | Hamlet | 331/109 |
| 4,254,382 | 3/1981 | Keller et al. | 331/116 R |
| 4,928,314 | 5/1990 | Grandfield et al. | 455/236 |

*Primary Examiner*—Siegfried H. Grimm
*Attorney, Agent, or Firm*—Pedro P. Hernandez; Daniel K. Nichols

[57] ABSTRACT

An actively biased oscillator (200) includes a set of current sensing components (214,216) for sensing the amount of current flowing into the first terminal of the amplifier; and a differential amplifier (212) responsive to the current sensing components for automatically adjusting the amount of current flowing into the second terminal of the amplifier.

8 Claims, 2 Drawing Sheets

ACTIVELY BIASED OSCILLATOR

TECHNICAL FIELD

This invention relates to oscillators circuits, and more specifically to an oscillator circuit having an active bias.

BACKGROUND

Most components used in building an oscillator such as a voltage controlled oscillator (VCO) have parameters that vary over temperature and input voltage. When the operating temperature of an oscillator changes, the transistor that comprises the amplifier section of the oscillator tends to have a corresponding change in gain. Changes in the input voltage of an oscillator circuit also affects the gain of the typical prior art oscillator circuit, thereby forcing the oscillator to draw more bias current.

A typical scheme used by the prior art for trying to maintain the gain of the transistor constant is by using constant current sources coupled to the transistor. The use of constant current sources help to maintain the current drawn by the active device substantially constant over its operating range. Constant current schemes unfortunately degrade the overall performance of the oscillator circuit and in particular the Hum and Noise figures of the communication device that the oscillator is part of. Also, constant current sources tend to be inherently noisy, thereby increasing the noise output of the oscillator circuit itself. Since the phase noise performance of an oscillator is very sensitive to changes in the transistor bias current of an oscillator, a need exists for the amplifier current to be maintained as constant as possible. For example, a shift of only 0.5 mA can cause an increase in phase noise of approximately a few dB's in a typical oscillator.

In FIG. 1 a schematic of a prior art voltage controlled oscillator (VCO) 100 is shown. Voltage controlled oscillator 100 is configured as a Hartley oscillator which is well known in the art. Oscillator circuit 100 includes an input port 102, oscillator section 108, output port 104, and operating voltage bias input port 106 (the required ground connections are shown inside of section 108). The oscillator section 108, includes an amplifier (active device) such as transistor 128. Transistor 128 is biased using resistors 110, 112, and 134. Voltage controlled oscillator 100 is typically used as part of a PLL synthesizer for use in communication equipment.

Typically, input port 102 receives a control voltage from a portion of a synthesizer like the one shown in FIG. 3. Oscillator 100 includes a tapped resonator element 124 having one end capacitively coupled via capacitor 126 to the base of NPN transistor 128, while the other end of the resonator is coupled to ground potential. Tapped resonator 124 is selectively tapped depending on the required operating parameters of oscillator 100 by one end of resistor 134 which is in turn coupled to the emitter of transistor 128. Tapped resonator 124 is used to provide the impedance transformation required to achieve the gain for oscillation. Oscillator 100 further includes a conventional tank circuit comprising of variable capacitor 122, capacitor 120, and varactor or "VARICAP" element 118. Oscillator 100 also includes capacitor 114 connected between input port 102 and ground, and a series connected inductor 116 between the input port and capacitor 120. The frequency of the Hartley oscillator 100 is varied by varying varactor 118 and variable capacitor 122. Also included as part of oscillator 100 is inductor 130 which is coupled between B+ terminal 106 and the collector of transistor 128. Finally, a coupling capacitor 132 is connected between the output port 104 and the collector of transistor transistor 128.

Since the operation of a conventional Hartley oscillator is well known to anyone skilled in the pertinent art, only the area of biasing of transistor 128 will be discussed. In the typical prior art oscillator, such as oscillator 100 of FIG. 1, the amplifier (in this case transistor 128) is normally biased by a series of resistors. In this particular case emitter resistor 134, and resistors 110 and 112 which form a voltage divider back to the base of transistor 128. The problem of biasing transistor 128 in this fashion is that a larger emitter resistance is typically required in order to properly bias transistor 128. Normally this is done to obtain the temperature stability and constant current characteristics across the frequency band of operation, which are required of a well designed oscillator. The problem with this approach is that the voltage across transistor 128 ($V_{CE}$) drops since other components that cause other voltage drops are in series with transistor 128. This drop in voltage across transistor 128 causes a loss in noise performance and power for circuit 100.

As can be seen from the above discussion, a need exists for a more efficient way of stabilizing the amount of bias current drawn by an oscillator over changes in temperature and input voltage. A stabilizing scheme should also be able to be integrated in order for the oscillator circuit to take up less real estate, and be less costly to manufacture.

SUMMARY OF THE INVENTION

The present invention provides an improved oscillator circuit having an active bias. The oscillator has an amplifier with first and second terminals and a current sensing means for sensing the amount of current flowing into the first terminal of the amplifier. A feedback means is responsive to the current sensing means for automatically adjusting the amount of current flowing into the second terminal of the amplifier.

In one aspect of the present invention, the oscillator is used in a synthesizer, while in another aspect the oscillator is utilized in a communication device.

DETAILED DESCRIPTION OF THE PREFERRED EMBODIMENT

Figure 1:
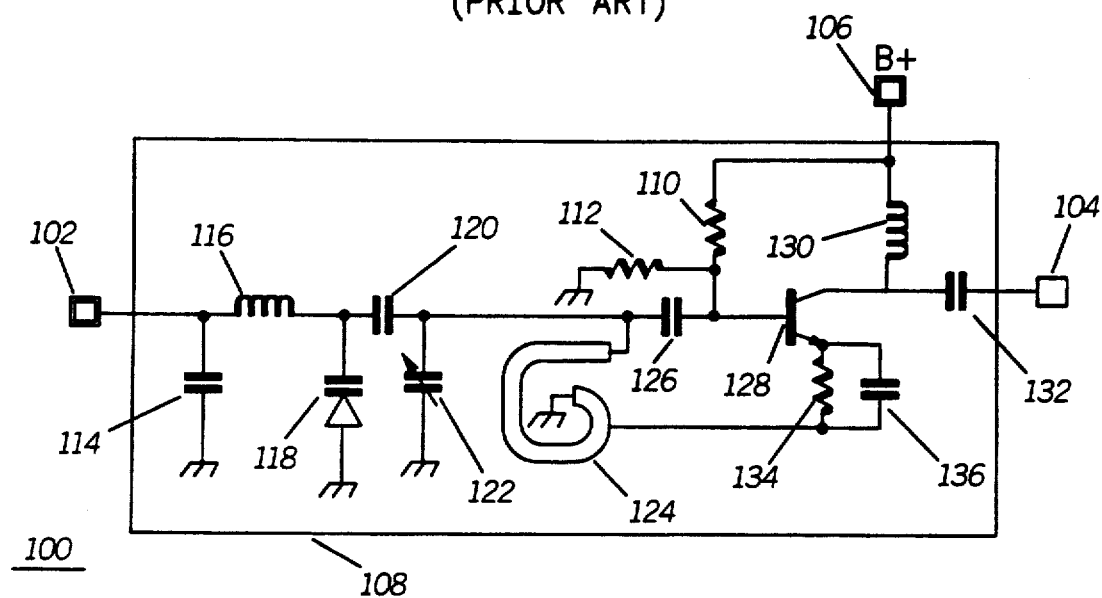
FIG. 1 shows a schematic of a prior art voltage controlled oscillator.
Figure 2:
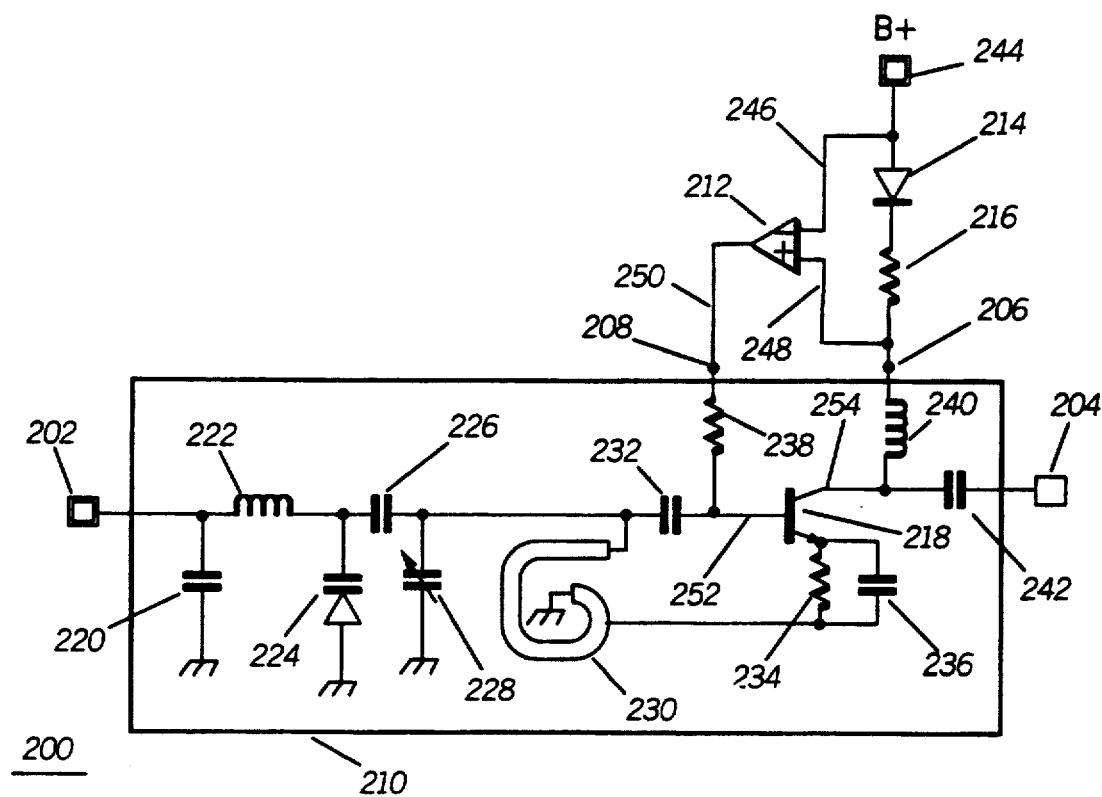
FIG. 2 shows a schematic of a voltage controlled oscillator in accordance with the present invention.

In FIG. 2 a schematic of a voltage controlled oscillator in accordance with the present invention is shown. Instead of biasing the active device or amplifier 218 with resistors such as done in FIG. 1 (prior art), an active feedback circuit utilizing differential amplifier 212 is employed. Diode 214, resistor 216, and inductor 240 are serially connected between the B+ terminal 244 and the coll 'tor 254 of transistor 218. Diode 214 and resistor 216 act as a current sensing means by dropping a corresponding amount of voltage across the two devices as the collector current changes in circuit 200.

Although the current sensing means has been shown here as a diode and resistor in series, those skilled in the art will realize that many different components could be utilized in their place. For example, using just a resistor, utilizing an inductive coil to determine the amount of collector current flowing, etc.

A feedback means, such as differential amplifier 212 has its negative terminal 246 connected to the B+ terminal 244, and positive terminal 248 connected to the junction of resistor 216 and inductor 240, which is located at first amplifier terminal 206. As the operating characteristics of Hartley oscillator 200 are varied by changes in temperature, frequency, or other parameters, any changes in the current flowing from the B+ terminal 244 down to transistor 218 (known as collector current, Ic) is measured by differential amplifier 212. Differential amplifier 212 then determines the amount of collector current by sensing the voltage difference between input terminals 246 and 248 (voltage drop across diode 214 and resistor 216) which causes amplifier 212 to generate a negative feedback current at amplifier output 250 in response to any changes in voltage at its input terminals. This negative feedback current is fed into second amplifier terminal 208 which is coupled to the base 252 of transistor amplifier 218, thereby automatically adjusting the bias of device 218. For example, if the $I_C$ increases, the voltage drop across the input terminals 246 and 248 of differential amplifier 212 increases, producing a lower output current at second terminal 208. Although the feedback means has been shown in the preferred embodiment as a differential amplifier 212, those skilled in the art will realize that automatic feedback can be accomplish by using discrete component circuitry, or other known devices. Similarly, NPN transistor 218 could be replaced by other amplification circuits or devices known to those skilled in the art.

By actively biasing the base of transistor 128, greatly improved temperature stability can be achieved over the prior art. Other benefits to the present invention include constant power output across the operating band of oscillator 200 at output 204, and improved carrier to noise ratio (CNR) due to the conservation of collector to emitter voltage of transistor 218 over the prior art. By using the present invention, no emitter resistor like that shown in FIG. 1 (resistor 134) would be required to be coupled to the emitter 234 of transistor 218 (if a resistor is used a smaller resistance would be required). This allows more of the voltage drop to be maintained across transistor 218, thereby improving the noise performance of oscillator 200.

The oscillator shown in FIG. 2 has advantages over other prior art biasing schemes such as the use of constant current sources at either the collector or emitter of transistor 128 as used in other prior art implementations (not shown). As discussed previously, the major problem with using constant current sources is that they introduce a voltage drop which degrades the performance of the oscillator and secondly they typically degrade the Hum and Noise figures of the oscillator output signal. Both of these problems are overcome by the present invention. In the oscillator shown in FIG. 2, diode 214 and resistor 216 are designed to drop no more than 1.5 Volts which is much less than the typical voltage drop of the prior art implementations, which tend to drop between 2 and 4 volts. By utilizing the present invention, a smaller valued emitter resistor 234 is required (as compared to resistor 134 utilized in FIG. 1) in order to properly bias transistor 218. The present invention allows for the sampling of a very small voltage (voltage drop across series connected diode 214 and resistor 216 which are connected to the input terminals of amplifier 212), which is then amplified by differential amplifier 212 and the resulting output is then applied via feedback to the base of the active device (transistor 218).

The present invention as shown in FIG. 2 allows for the oscillator to draw a fairly stable amount of bias current over wide variations in operating temperatures and operating voltages as compared to the prior art. In a typical application the oscillator of FIG. 2 displays a reduction of approximately 50% in current variation (max. to min. amount of bias current required) from the prior art oscillator shown in FIG. 1, over varying operating conditions (e.g. changes in operating temperature, input voltage, etc.). By maintaining the delta change in current small noise performance is maximized, since in any typical oscillator a slight change in current (such as a change of 0.5 ma) can affect the noise performance by as much as several dB's.

The above discussion has shown that by maintaining an active bias on transistor 218, the current used by oscillator circuit 200 can be maintained fairly constant over changes in ambient temperature and changes in input voltage. The present invention also does not exhibit the phase noise problems attributed to constant current circuits used by the prior art.

Figure 3:
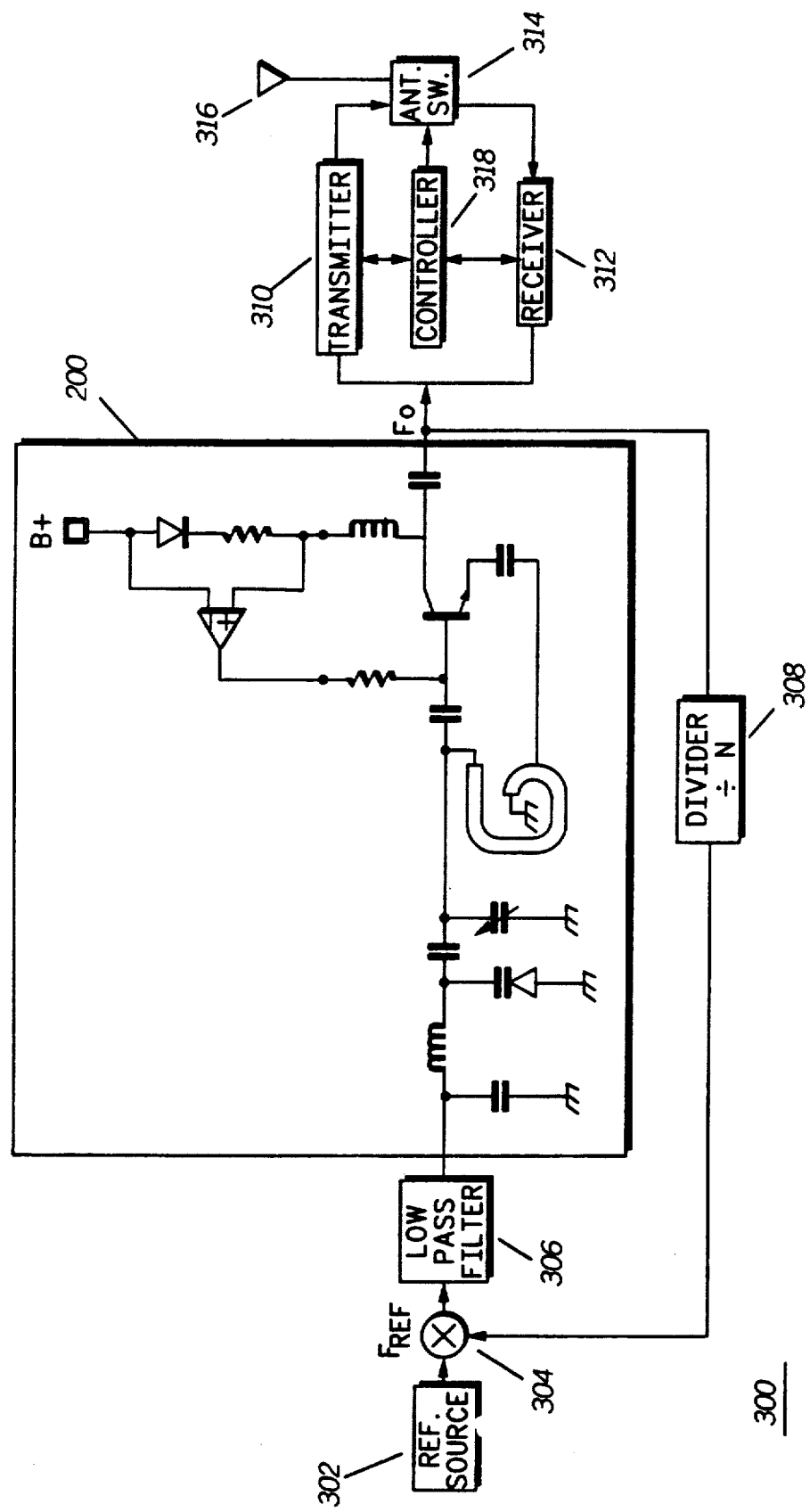
FIG. 3 is a block diagram of a communication device in accordance with the present invention.

In FIG. 3 a block diagram of a communication device 300, such as a conventional radio using the present invention is shown. Radio 300 comprises a receiver 312 and transmitter 310 selectively coupled to antenna 316 via antenna switch 314. Radio controller 318 can be a conventional microprocessor or microcontroller with appropriate memory and I/O capabilities, as known in the art. Controller 318 controls the operation of both receiver 312 and transmitter 310, and also selectively activates antenna switch 314 when required. Also included as part of radio 300 is a conventional phase lock loop (PLL) synthesizer section making up the rest of radio 300 utilizing the automatically biased oscillator of the present invention 200. The synthesizer includes reference oscillator source 302 which produces a reference signal having frequency $F_{ref}$. The signal of frequency $F_{ref}$ is in turn applied to the first input of phase detector 304. The phase detector 304 has a second input coming from the divide-by-N or loop divider circuit 308 which divides the output signal Fo of voltage controlled oscillator (VCO) 200. In order to generate one of a number of desired synthesized frequencies, the synthesized frequency Fo is scaled by a divisor N from circuit 308. The divisor N is chosen to correspond to the desired synthesized frequency. Coupled to phase detector 304 is low pass loop filter 306 which is in turn connected to the input of oscillator 200 for providing the control voltage to oscillator 200. The output signal Fo of voltage controlled oscillator (VCO) 200 is in turn coupled to the transmitter 310 and receiver 312 sections of radio 300.

As has been shown, the present invention allows a oscillator circuit such as the RF Hartley oscillator of the preferred embodiment to maintain a substantially constant voltage drop across the active device ($V_{CE}$ of transistor 218) over changes in operating conditions such as changes in temperature and operating frequency. By actively biasing the active device of the oscillator via a negative feedback loop, the oscillator 200 exhibits greatly improved temperature stability than the prior art. Another benefit of the present invention is that in the case of an RF oscillator used in a communication device such as shown in FIG. 3, constant power is helped to be maintained across the operating band of the communication device by maintaining a constant voltage drop across transistor 218. Improvement in performance of the present invention over the prior art can be found in the area of increased Hum and Noise performance over that of constant sourced designs. Carrier to Noise ratios (CNR) are also improved when the oscillator is part of a communication device like that shown in FIG. 3.

Finally, the design of the present invention is capable of being integrated into an integrated circuit (IC) which the prior is incapable of due to the use of large inductors and capacitors involved in their designs. Since the present invention requires no large valued capacitors or inductors it is capable of being integrated into an integrated VCO package. By integrating the VCO, a simpler VCO package can be manufactured.

What is claimed is:

1. An actively biased oscillator having an amplifier with first and second terminals, comprising:
   a current sensing means for sensing the amount of current flowing into the first terminal of the amplifier; and
   a feedback means responsive to the current sensing means for automatically adjusting the amount of current flowing into the second terminal of the amplifier.

2. The actively biased oscillator of claim 1, wherein the feedback means consists of a differential amplifier having first and second input terminals and a first output terminal, the current sensing means being coupled between the first and second input terminals of the differential amplifier and the first output terminal of the differential amplifier being coupled to the second terminal of the amplifier.

3. The actively biased oscillator of claim 2, wherein the actively biased oscillator is a Hartley oscillator.

4. A synthesizer, comprising:
   a phase detector; and
   a low pass filter coupled to the phase detector; and
   an actively biased Hartley oscillator having an amplifier with first and second terminals including a current sensing means for sensing the amount of current flowing into the first terminal of the amplifier and a feedback means responsive to the current sensing means for automatically adjusting the amount of current flowing into the second terminal of the amplifier, the oscillator being coupled to the low pass filter.

5. The synthesizer of claim 4, wherein the feedback means consists of a differential amplifier having first and second input terminals and a first output terminal, the current sensing means being coupled between the first and second input terminals of the differential amplifier and the first output terminal of the differential amplifier being coupled to the second terminal of the amplifier.

6. A communication device, comprising:
   a receiver; and
   an actively biased oscillator having an amplifier with first and second terminals including a current sensing means for sensing the amount of current flowing into the first terminal of the amplifier and a feedback means responsive to the current sensing means for automatically adjusting the amount of current flowing into the second terminal of the amplifier, the receiver being coupled to the actively biased oscillator.

7. The communication device of claim 6, wherein the feedback means consists of a differential amplifier having first and second input terminals and a first output terminal, the current sensing means being coupled between the first and second input terminals and the first output terminal being coupled to the second terminal of the amplifier.

8. The actively biased oscillator of claim 7, wherein the actively biased oscillator is a Hartley oscillator.

* * * * *